United States Patent [19]

Tissot

[11] 4,190,879
[45] Feb. 26, 1980

[54] PLASTIC CHASSIS WITH MAGNETIC HOLDING MEANS FOR ELECTRONIC COMPONENTS

[76] Inventor: Pierre L. Tissot, 863 Via de la Paz, Pacific Palisades, Calif. 90272

[21] Appl. No.: 935,487

[22] Filed: Aug. 21, 1978

[51] Int. Cl.² ............................................. H05K 7/20
[52] U.S. Cl. .................................. 361/386; 339/12 L; 200/61.45 M
[58] Field of Search ...................... 248/27.1; 339/12; 200/61.45 M, 293, 296, 294, 318, 321, 323; 361/331, 380, 386–388; 357/79, 81

[56] References Cited

U.S. PATENT DOCUMENTS

| 2,738,476 | 3/1956 | Buquor | 339/12 L |
| 3,686,533 | 8/1972 | Garnier | 361/386 |
| 3,713,370 | 1/1973 | Prijn | 339/12 L |
| 3,777,220 | 12/1973 | Tatusko | 361/386 |

OTHER PUBLICATIONS

Magnetically Secured IC Package, Landwer, Western Electric, Tech. Digest No. 28, Oct. 1972, p. 25.

*Primary Examiner*—Gerald P. Tolin
*Attorney, Agent, or Firm*—Ralph B. Pastoriza

[57] ABSTRACT

The system includes basically the provision of a plastic chassis together with magnetic members for holding electronic components onto the chassis. Such components may comprise transistors, circuit board modules and the like. A preferred application of the system is in the manufacture of television receivers. For each component there is provided a magnetic ring embedded in the plastic chassis or in a heat sink in turn embedded in the plastic chassis. A cooperating collar member of magnetically responsive material mounts a transistor, circuit board module or the like. Asymmetrical plugs and sockets are provided about the outside of the collar and ring respectively so that the transistor or circuit board module can only be inserted in the chassis when in a unique orientation. The collar and magnetic ring in such orientation are precisely aligned to provide full surface contact and thereby hold the component to the chassis and yet permit easy manual removal and replacement without tools.

7 Claims, 6 Drawing Figures

PLASTIC CHASSIS WITH MAGNETIC HOLDING MEANS FOR ELECTRONIC COMPONENTS

BACKGROUND OF THE INVENTION

This invention relates generally to an electronic system serviceable by the consumer and more particularly to an electronic chassis and components therefor preferably as used in television receivers.

Present day electronic systems such as television receivers generally utilize a metallic chassis to which heat sinks are secured by metal screws in appropriate locations. Transistors such as power transistors requiring heat dissipation are then mounted on the heat sink requiring the use of electrically insulative washers, metal screws, lock washers, bolts and the like. Circuit board modules are held down on to the chassis by some mechanical retaining means, usually steel clips. These retainers tend to get overlooked and inadvertent preying is often times attempted with the result of damaged modules. My invention does away with mechanical retainers.

As will become clearer as the description proceeds, not only do prior are transistor mountings make it difficult and time consuming to replace a transistor, but in addition, the mountings themselves do not provide for really effective heat dissipation over prolonged periods of time. Further, some prior art designs can result in a wrongful module insertion by rotation of 180° with consequent damage. Thus, servicing of prior art electronic systems requires the skills of experienced service personnel.

SUMMARY OF THE PRESENT INVENTION

The present invention contemplates the provision of a new type of chassis, heat sink and component design overcoming the above-mentioned difficulties. More particularly, the system of this invention permits a consumer or layman to effect virtually all types of repair in that transistors, circuit board modules and the like can be readily removed and replaced by the consumer or layman himself without tools and wherein there is virtually no possibility of inserting the transistors or circuit board modules incorrectly. This resulting "consumer-friendly" system thus essentially re-introduces the lost art of the household fuse and the radio tube replacement in a perfected form.

Briefly, the system includes in combination a plastic chassis, electrical components for the chassis, and magnetic means for holding the components onto the chassis, thereby permitting manual removal and replacement thereof without tools.

In some embodiments of the invention, the magnetic means takes the form of a magnetic ring embedded in a heat sink in turn embedded in the plastic chassis to always form a permanent part of the chassis. The component in turn is secured to a collar member of magnetically responsive material which not only magnetically holds the component to the chassis but additionally aids in heat dissipation through the heat sink. In other embodiments, the magnetic ring is simply embedded in the plastic chassis itself without a heat sink, this situation occurring wherein a particular component does not require high heat dissipation.

In all of the embodiments, the chassis includes electrical socket means asymmetrically positioned about the ring magnet and each of the components includes electrical connector means in similar asymmetrical positions so that the component must be in a unique orientation to have its connector means received in the proper socket means. In this unique orientation, the magnetic ring and collar member are properly aligned for maximum attraction so that proper securement of the component and connections to the chassis is assured.

BRIEF DESCRIPTION OF THE DRAWINGS

A better understanding of this invention as well as many further features and advantages thereof will be had by now referring to the accompanying drawings in which.

DETAILED DESCRIPTION OF THE INVENTION

Figure 1:
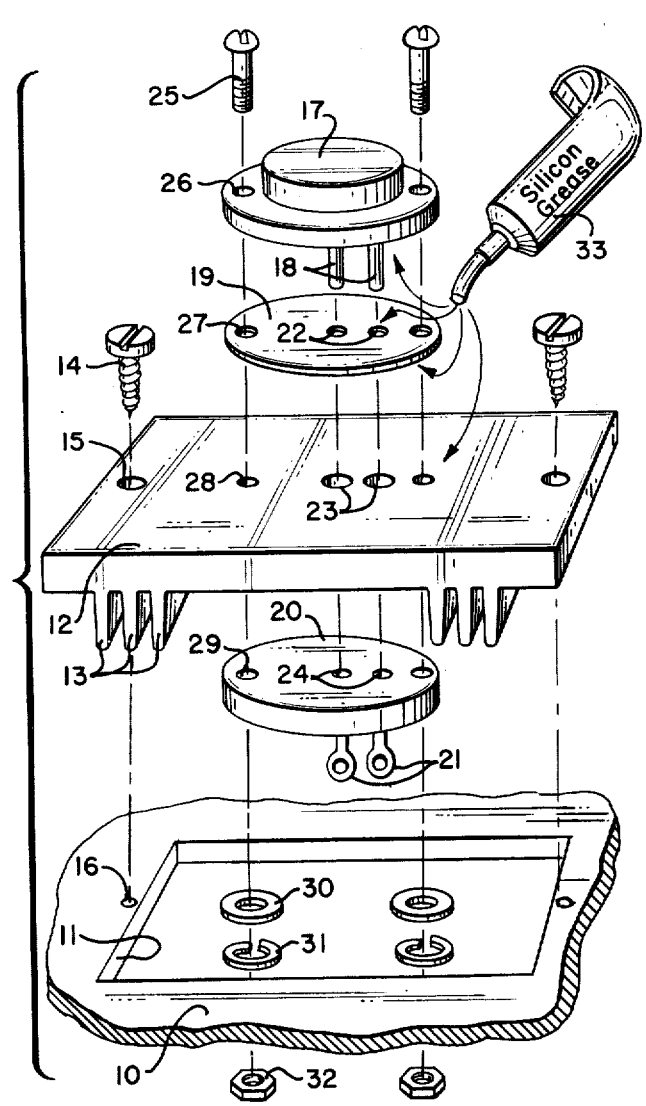
FIG. 1 is an exploded perspective view of a typical prior art transistor mounting on a metallic chassis useful in understanding the unique distinctions and advantages of the present invention.

Referring first to FIG. 1, there will first be described a typical prior art mounting of a transistor on a metal chassis as is commonly presently carried out in television receivers and other electronic systems. Starting at the lower portion of FIG. 1, there is shown a fragmentary portion of a metallic chassis 10 provided with a cut-out 11 for mounting of a heat sink 12, the latter being shown in the central portion of FIG. 1. Heat sink 12 is provided with fins 13 on its underside for heat dissipation to circulating air. Self-tapping screws indicated at 14 are passed through appropriate holes 15 in the heat sink to mount the same in further holes 16 in the metal chassis 10.

The typical "top hat" type transistor to be mounted is illustrated in the top of FIG. 1 at 17 and normally includes two downwardly extending connector pins 18. A mica washer 19 is provided in order to electrically insulate the metal transistor 17 from the heat sink 12. The transistor socket itself is shown at 20 beneath the heat sink 12 provided with appropriate connector lugs 21.

The mica washer 19 is provided with holes 22 through which the transistor connector pins 18 pass. The heat sink 12 also includes holes 23 which are oversized so as not to make electrical contact with the pins 18 when passed therethrough. Finally, the socket 20 includes pin receiving openings 24 for the pins 18, the pins making electrical contact with the terminal lugs 21.

The described elements comprised of the transistor 17 mica washer 19, heat sink 12 and transistor socket 20 are assembled and held in stacked relationship by appropriate machine screws one of which is shown in the top left of FIG. 1 at 25. Thus, each machine screw would pass through aligned holes 26, 27, 28 and 29 in the transistor, mica washer, heat sink and socket respectively, the assembly being secured by an appropriate washer 30, lock washer 31 and nut 32 for each machine screw.

With the transistor and transistor socket securely mounted to the heat sink 12, the heat sink itself can then be fastened by the screws such as indicated at 14 to the metallic chassis 10.

It can be appreciated from the foregoing that assembly and disassembly of the various described elements in order to change a transistor can be a very time-consuming operation. Even more serious, however, is the problem of assuring proper heat dissipation with this described arrangement. More particularly, the mica washer 19 electrically insulating the transistor from the heat sink also functions to serve as a thermal barrier to dissipation of heat from the transistor to the heat sink.

Because of this thermal barrier, it is the present-day practice to introduce a silicon grease on the underbelly of the transistor 17, both sides of the mica washer 19 and onto the top engaging portion of the heat sink 12, all as indicated by the silicon grease container 33 and arrows. While the provision of this silicon grease will initially improve the heat transfer from the transistor to the heat sink, it is a nuisance to apply particularly to the underbelly of the transistor because of interference of the pins. Moreover, the grease hardens automatically in a few years forming a thermal barrier leading to overheating and breakdown of the transistor, desirable from certain unethical view points. Also, because the mica washers are quite thin, two mica washers may accidentally be applied in production operations as they have a tendency to stick together. In this latter event, the thermal barrier effect of the single mica layer is doubled.

In the event of a breakdown, a skilled serviceman must be called and he supposedly is expected to wash out the old grease with solvents, dry the parts and apply new grease. Actual field experience indicates that this is rarely done. Small grease tubes such as 33 and instructions thoughtfully packed by the manufacturer, are ignored and the new transistor is bolted onto the crusty remains of the original silicon grease. The life of the newly mounted transistor is then extra short and the reputation of the original manufacturer suffers.

Figure 2:
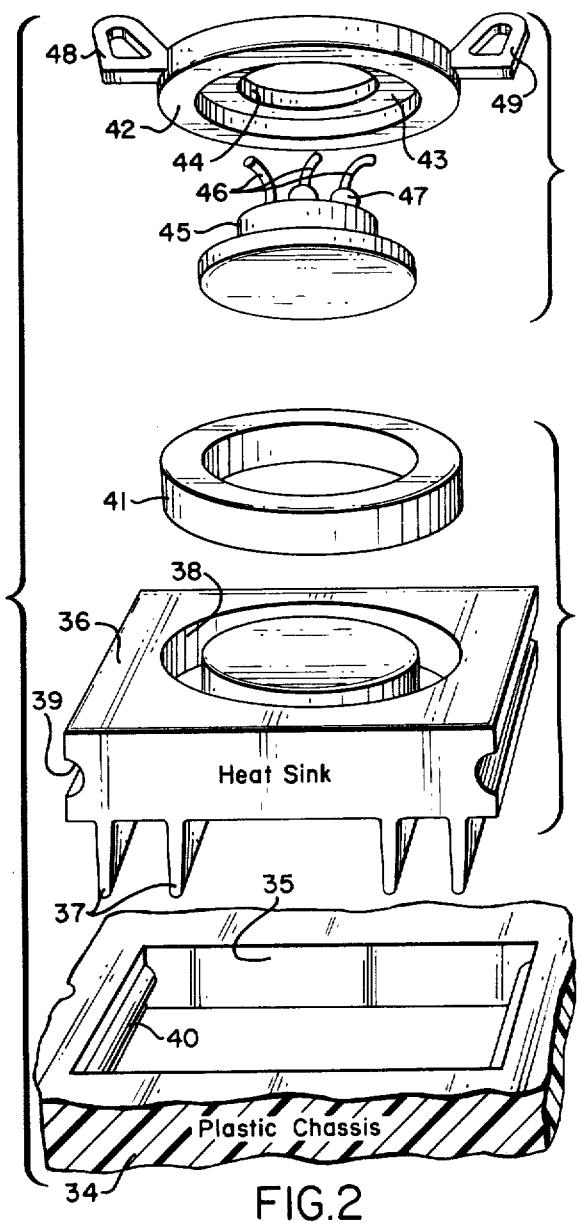
FIG. 2 is an exploded perspective view of a transistor mounting to a plastic chassis in accord with an embodiment of the present invention.

Referring now to FIG. 2, there is shown a first embodiment of the present invention which overcomes all of the foregoing problems described in FIG. 1 in the mounting of a transistor to a chassis.

Thus, in the embodiment of FIG. 2 there is shown in the lower portion a plastic chassis 34 as opposed to a metal chassis. Plastic chassis 34 is provided with a cut-out 35 for receiving a heat sink 36. Heat sink 36 in turn includes the usual air cooling fins 37 on its underside, an annular cavity 38 formed on its top surface and edge grooves 39 on opposite side portions. The edge grooves 39 cooperate with ribs 40 formed in the cut out 35 of the plastic chassis so that the heat sink 36 can be permanently embedded in the chassis thereby doing away with the metal screws heretofore required.

Shown exploded above the heat sink 36 is a magnetic ring 41 arranged to be permanently embedded in the heat sink 36 by reception in the annular cavity 38 by the press fitting method and this step is performed at the heat sink manufacturer's level. The embedding of the magnetic ring in the heat sink is such that there is exposed a flat annular top surface of the magnetic ring coplanar with the top surface of the heat sink. The heat sink itself is so designed that when embedded in the cut-out 35 of the plastic chassis 34, its top surface is coplanar with the top surface of the chassis so that the top annular surface of the magnetic ring 41 is also coplanar with the top surface of the chassis.

Cooperating with the magnetic ring 41 there is shown in the top portion of FIG. 2 a collar member 42 of magnetically responsive material. This collar member has an exposed flat annular bottom surface which is congruent to the exposed flat annular top surface of the magnetic ring 41.

In addition, the collar member 42 includes electronic component holding means. Where the component to be held is a transistor, this means includes an annular step 43 formed in the collar by a reduced diameter opening 44 for receiving and seating a transistor indicated below the collar at 45. More specifically, the "hat band" area of the transistor 45 and the reduced opening 44 of the collar member 42 are chosen so that the two are conically binding. They are then permanently united by the press fitting method at the transistor manufacturers level. As the description proceeds, it will be noted later that collar members such as 42 are also used alone and not in conjunction with a transistor in some of the inventor's embodiments.

It will be noted that transistor 45 rather than having connector pins extending from its underbelly includes three wire leads 46 extending from the top. Two of the leads shown on the right half top of the transistor 45 are insulated from the metal of the transistor by glass beads such as indicated for one of the leads at 47. The third wire lead 46 to the left of the other two connects to the metal body of the transistor. Because this transistor is secured in the collar member 42, there are not required any mounting holes such as the holes 26 for the transistor 17 of FIG. 1. Moreover, a normally provided special bolt and connector for connecting the metal portion of the transistor 17 of FIG. 1 is replaced by the third described wire lead 46 connecting directly to the metal portion of the transistor 45.

It should be understood in FIG. 2 that while the component 45 has been described as a transistor, it could be a diode, triac, or other electrical component requiring heat dissipation. Regardless of the particular type of component, it is provided with a flat metal bottom, this bottom being coplanar with the exposed flat annular bottom surface of the collar member 42 when held in the collar member.

Also shown on the collar member 42 in FIG. 2 are diametrically opposite laterally extending tabs or ears 48 and 49 integrally formed with the collar. As will become evident as the description proceeds, these ears also constitute an electronic component holding means for circuit board type modules.

Figure 3:
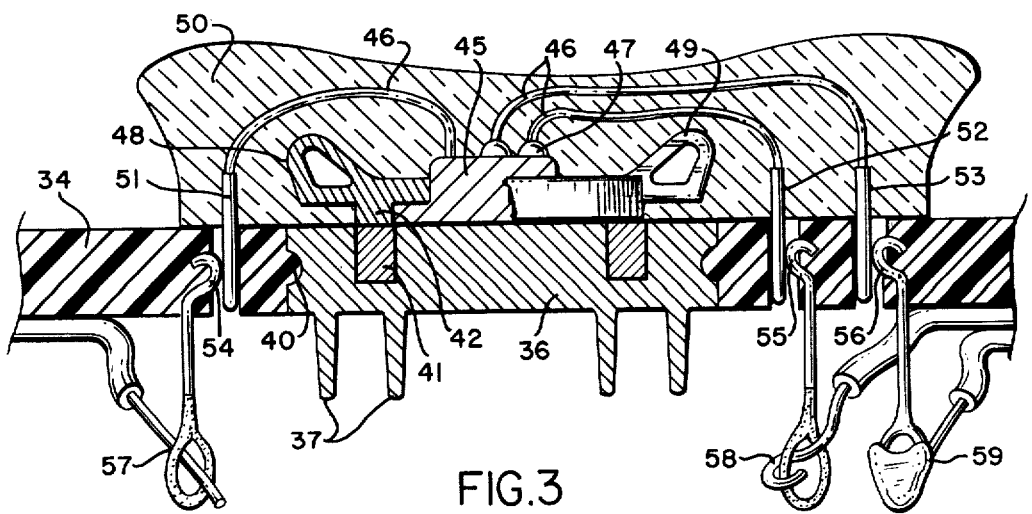
FIG. 3 is a cross section of the assembled elements of FIG. 2 on the plastic chassis with the addition of a glass encapsulation.

Referring now to FIG. 3, there are shown the various elements described in FIG. 2 in assembled relationship together with the addition of a glass encapsulation 50 within which electrical connector pins 51, 52 and 53 are held with downwardly extending portions exposed. The glass encapsulation 50 still leaves exposed the flat annular bottom surface of the collar member but otherwise completely encloses the collar member including the ears 48 and 49 so that a self-contained rigid structure results with inherently safe consumer handling aspects.

The plastic chassis 34 reproduced in FIG. 3 in cross section is shown with the heat sink 36 permanently embedded therein and held by the cooperating ribs 40. Also shown is the magnetic ring 41 embedded in the heat sink 36 and the coplanar relationship of the flat annular top surface of the ring with the heat sink 36 and chassis 34 is evident.

It will also be noted that the various transistor wire leads 46 described in FIG. 2 have been connected to the glass embedded connector pins 51, 52 and 53. These connector pins are asymmetrically disposed about the collar member 42 within the glass encapsulation 50 in the sense that there are provided one pin on the left and two pins on the right as viewed in FIG. 3.

Chassis 34, in turn, is provided with electrical connecting socket contact means with spring connectors 54, 55, and 56 formed in the chassis in corresponding asymmetrical positions outside the flat annular top surface of the magnetic ring 41 for receiving the electrical connector pins when the collar member is in the given orientation shown. In other words, because of the asymmetrical relationship of the connectors and sockets, there is only one way in which the electrical component can be inserted in the chassis and in this particular orientation it will be noted that the exposed annular surfaces of the magnetic ring 41 and collar member 42 are precisely aligned to effect full surface contact. Moreover, the flat metallic bottom of the transistor 45 is in full surface contact with the top of the heat sink 36 so that excellent heat transfer is assured.

The encapsulation of the transistor, upper portion of the collar member, upper portions of the wire terminals together with portions of the electrical connector pins connected to the wire terminals provides a complete unitary body, the glass being so shaped as to permit easy manual grasping thereof to remove and replace the transistor component on the chassis. No tools whatsoever are required. In the insertion of the component, the connector pins or plugs are initially inserted in the corresponding socket contact openings in the plastic chassis 34 thus guiding the encapsulated component to its fully inserted position shown in FIG. 3, the engagement of the annular surfaces of the magnetic ring 41 and collar member 42 resulting in a reassuring "click," thereby resulting in secure holding and proper connections of the electrical components.

Preferably, the glass encapsulated power transistor of FIG. 3 would be used in industrial applications as opposed to home television receivers and therefore is not referred to hereafter as a component part of television chassises.

Still referring to FIG. 3, there is indicated below the chassis 34 the extension of the electrically connecting spring connectors 54, 55 and 56 wherein these elements terminate in lugs for soldering to appropriate wires as indicated at 57, 58 and 59. Merely for illustrative purposes, the steps in soldering the lugs to connecting wires are illustrated for the three lugs 57, 58 and 59. Thus lug 57 shows a wire passing straight through the lug opening, 58 illustrates the wire bent over the lug and 59 illustrates the soldered connection. The lugs 57 and 58 are shown with a resin coating indicated by the stippling so that electrical contact will not be effected until actual soldering takes place which functions to evaporate the resin so that it does not appear as indicated for the soldered connection 59. This resin coating, which is inhibiting electrical contact, will assure that all proper soldering takes place since a failure to solder a lead passing through the lug or even bent around the lug will result in an "open" connection which can readily be detected during the quality control check-out phase of production.

The provision of the resin is in accord with the teachings set forth in my U.S. Pat. No. 4,090,655 issued May 23, 1978 and entitled METHOD FOR INSURING SOLDERED CONNECTIONS. The method described in my patent can be advantageously used in the present invention to assure the manufacture of high quality electronic systems.

Figure 4:
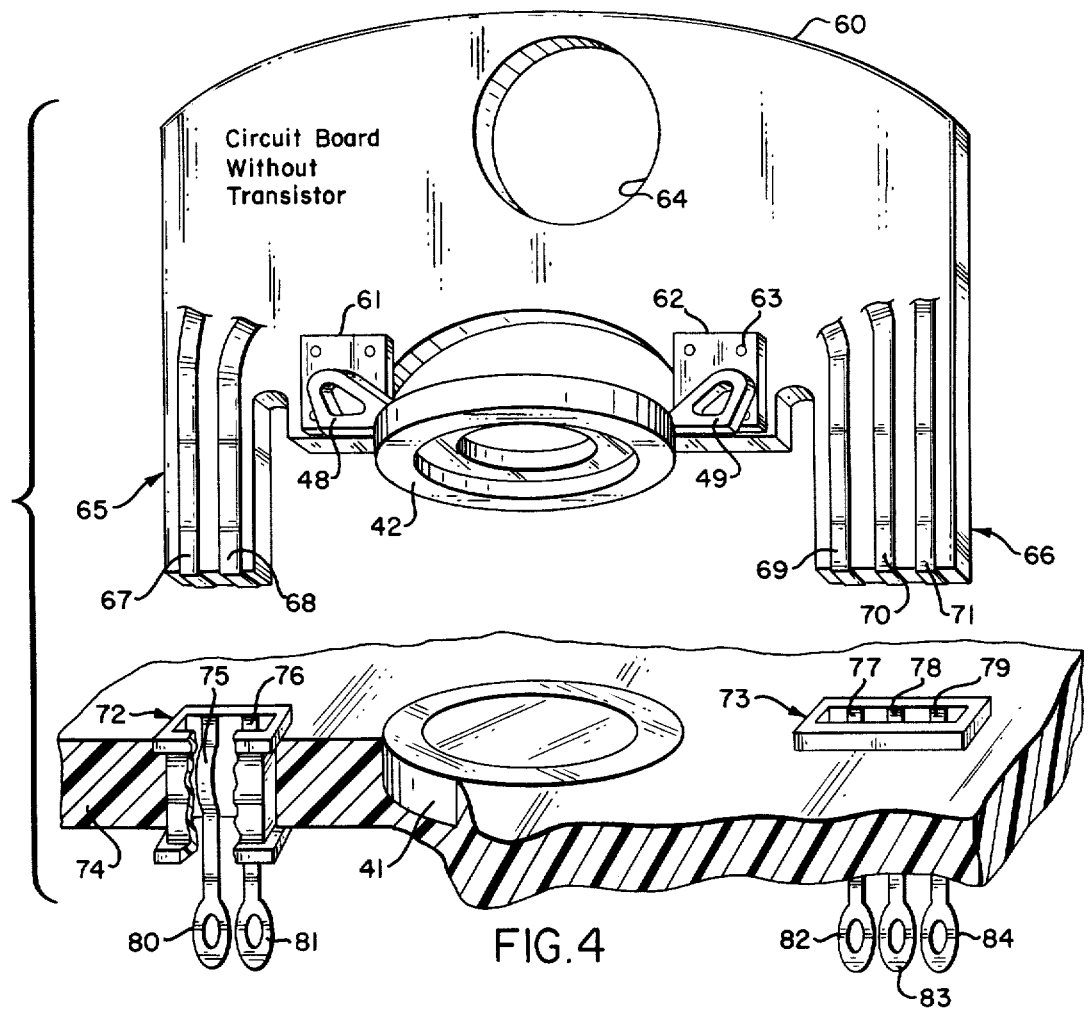
FIG. 4 is a broken away perspective view illustrating a circuit board module preparatory to being inserted in a plastic chassis in accord with the present invention.

Referring now to FIG. 4, there is illustrated another type component for mounting on a plastic chassis in accord with the present invention in the form of a circuit board, usually of the etched-foil type. The magnetic ring 41 is shown embedded directly in the plastic chassis rather than in a heat sink inasmuch as the particular circuit board 60 does not incorporate a transistor and is set forth as an example of a component not requiring heat dissipation. Again, the flat annular top surface of the magnetic ring 41 is coplanar with the top surface of the plastic chassis.

In the embodiment of FIG. 4, the collar member 42 is identical to the collar member 42 described in FIGS. 2 and 3. In FIG. 4 is shown an alternate method of holding a component onto the collar member 42. This holding means for the component constitutes the lateral ears 48 and 49 previously mentioned in conjunction with FIG. 2. In this mounting, there are provided two sheet brass overlays 61 and 62 directly secured to the circuit board 60 as by rivets, one of which is shown at 63. The ears 48 and 49 of the collar member 42, in turn, are soft soldered to these brass overlays for connection thereto. Such soldered mounting permits removal of the collar.

The circuit board 60 as shown in FIG. 4 is provided with a finger gripping opening 64 to permit easy handling thereof in mounting the same on the plastic chassis, all as will become clearer as the description proceeds. The surface of the board itself would contain numerous conducting paths provided by foil strips together with other electronic components and the like, these being omitted for purposes of clarity. However, the circuit board is shaped to define left and right plugs designated generally by the numerals 65 and 66 which carry terminal end portions of such foil strips requiring connection. Thus, for example, the left plug 65 includes foil strips 67 and 68 while the right plug 66 includes foil strips 69, 70 and 71.

These foil strip portions constitute broadly downwardly extending connectors and while only a few such strips have been shown, such connectors may be many more in number on any one of the plugs. Moreover, it will be noted that the left and right plugs are asymmetrical; that is, in the example illustrated the left plug 65 is not as wide as the right plug 66.

Left and right socket structures designated generally by the arrows 72 and 73 are shown embedded in a plastic chassis 74. In the particular embodiment of FIG. 4, the plastic chassis is designated by the numeral 74 to distinguish it from the chassis described in FIGS. 2 and 3 in which a heat sink is embedded. The chassis 74 might be a television receiver chassis while the plastic chassis described in FIG. 3 might constitute any electronic chassis wherein transistors are to be inserted and removed.

These socket structures 72 and 73 include spring strip contacts 75, 76 and 77, 78 and 79 respectively. These strips continue downwardly out the bottom of the socket to terminate in solder lugs 80, 81 and 82, 83 and 84 respectively. The dimensioning of the sockets 72 and 73 is such as to receive snugly the left and right plugs 65 and 66 of the circuit board 60 respectively.

It can thus be appreciated from the foregoing, that the circuit board module 60 can only be inserted one way; that is, in a unique orientation. Moreover, when the same is inserted, proper contact will be effected between the foil strips on the plug and the corresponding spring strips in the socket. As in the embodiment of FIG. 3, proper alignment of the magnetic ring 41 with the collar member 42 is assured so that the circuit board 60 is properly and securely held to the chassis without the use of prior art retainers.

Figure 5:
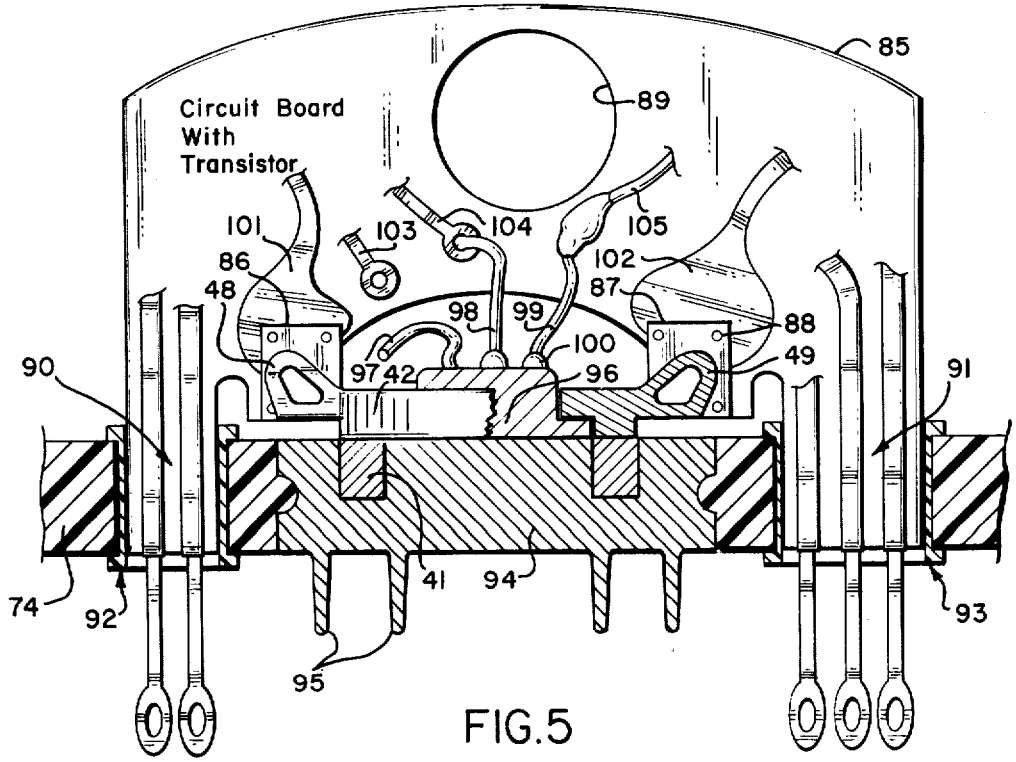
FIG. 5 is a cross section of another circuit board module incorporating a transistor secured in the plastic chassis in accord with the present invention.

Referring now to FIG. 5, there is shown another circuit board module designated 85 which incorporates a transistor, the transistor itself being held within the collar member. Thus, as in the case of the circuit board 60 of FIG. 4, the circuit board 85 is provided with brass overlays 86 and 87 secured by rivets such as rivet 88 to which the ears of the collar member 42 are soldered. A finger grip opening 89 is also provided as well as left and right downwardly extending plug portions designated generally by the numerals 90 and 91.

A portion of the same plastic chassis 74 of FIG. 4 includes correspondingly positioned left and right sockets 92 and 93 for reception of the plugs, the plugs and sockets being asymmetrically arranged as in the case of FIG. 4 so that there is only one correct manner for inserting the module.

Inasmuch as the circuit board 85 includes a transistor as a part of the modular arrangement, there is provided a heat sink 94 embedded in the portion of the plastic chassis 74 shown provided with the usual cooling fins 95. The magnetic ring 41 is in this embodiment embedded in the heat sink the same as in the embodiment of FIG. 2 with its flat annular top surface coplanar with the top surface of the heat sink 94 and the chassis 74.

Shown nested within the collar member 42 is a transistor 96 and, as in the case of FIGS. 2 and 3, the metallic flat bottom of the transistor 96 is in full surface contact with the top of the heat sink 94 for proper thermal transfer. Transistor 96 which might be a different transistor from the transistor 45 described in FIGS. 2 and 3 includes top wire terminals 97, 98 and 99, the terminals 98 and 99 again being insulated from the metallic transistor 96 as by glass beads, one of which is shown at 100.

In the circuit board module 85 of FIG. 5, there are illustrated large foil areas 101 and 102 in intimate electrical and mechanical contact with the brass overlays 86 and 87. Unavoidably, some heat is received by the collar ears. These ears, brass overlays and large foil areas then cooperate in the harmless dissipation of this residual heat so as not to affect adversely the plastic module body 85.

Further foil strips with terminals are shown at 103, 104 and 105 constituting part of an etched-foil circuit on the surface of the circuit board 85. Again, as an example of appropriate connections between the transistor and the circuit board, one of the wire terminal leads such as 97 from the transistor 96 is shown disconnected from an appropriate terminal foil strip 103 while the next transistor wire lead 98 is shown pushed through the opening formed in the circuit board 85 for subsequent soldering to the terminal foil strip 104. The last wire lead 99 from the transistor 96 is shown completed by having been properly soldered to the terminal foil strip 105.

As in the case of FIG. 4, the collar ears 48 and 49 and brass overlays 86 and 87 are first factory pre-tinned and later in production soft soldered together. This soldering is an important feature of my invention since, at a repair person's option, a new transistor can economically be soldered in if it is desired to repair a module on hand. Moreover, very precise mechanical alignment of the parts may first be obtained magnetically on the chassis with a subsequent locking-in of the parts by soldering while still on the chassis.

Figure 6:
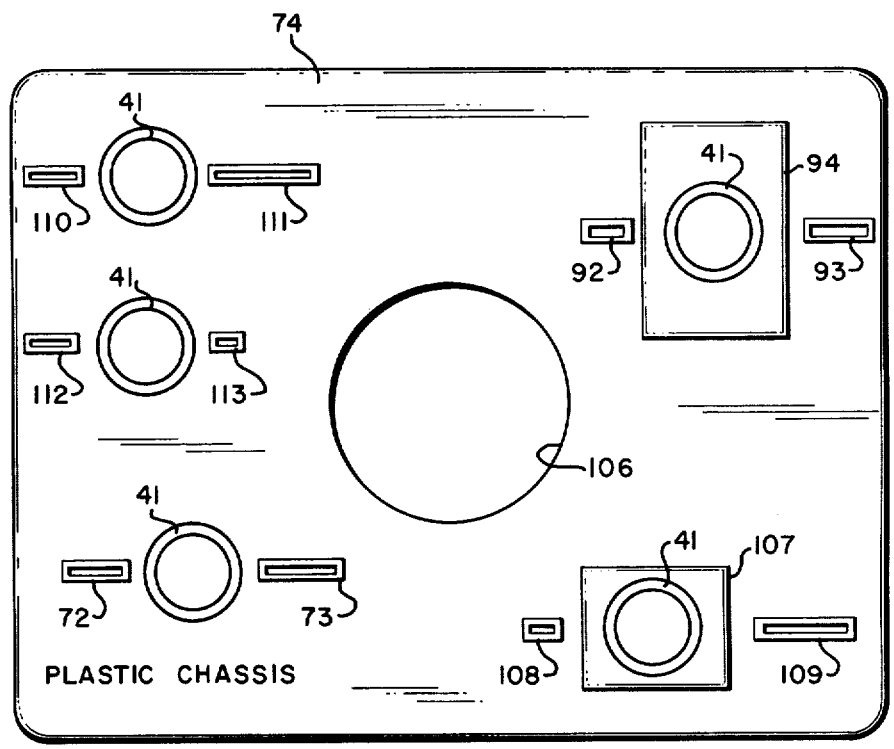
FIG. 6 is a top plan view of a plastic chassis such as used for a television receiver designed in accord with the present invention and as a portion would appear in the absence of components to be held by the chassis.

Referring now to FIG. 6, there is shown a portion in plan view of the chassis 74 without any of the described electronic components mounted thereon. In the example shown in FIG. 6, the chassis portion 74 constitutes a television chassis and towards this end there is provided a relatively large opening 106 for receiving the neck of a television picture tube.

In the lower left portion of the circuit board 74 there are illustrated the left and right sockets 72 and 73 described in FIG. 4 while in the upper right hand portion of the chassis there are shown the left and right sockets 92 and 93, together with the heat sink 94 described in FIG. 5.

To the lower right of the chassis there is illustrated another heat sink 107 which is of a different area from the heat sink 94 merely to illustrate the fact that the heat sinks need not all be of the same size. For example, in the case of a power transistor requiring relatively large heat dissipation, a large heat sink such as 94 would be used whereas for components requiring less heat dissipation the smaller heat sink 107 could be used. Appropriate left and right sockets 108 and 109 again asymmetrical in shape are provided for receiving an electronic component.

In the upper left of the chassis 74 of FIG. 6 are shown further left and right sockets such as 110, 111, 112 and 113 about and exterior to magnetic rings 41. The showings of these additional sockets and rings is merely to illustrate that while the sockets themselves may be of different asymmetrical shapes so that only the proper corresponding electronic components can be received therein, the magnetic rings can all be identical. Accordingly, the collar members cooperating with the rings whether used to mount a transistor or a circuit board or both a transistor and circuit board can all be identical.

It can now be appreciated from all of the foregoing that various electronic components whether single transistors or circuit board modules with or without transistors can easily and readily be mounted and removed from an electronic chassis. As a result, the many prior art items eliminated are: module retaining clips, service person's module lift-out tools, machine screws, self-tapping metal scres, nuts, plain, insulative and lock washers, plastic transistor sockets, sheet mica stampings or washers, silicon grease applications, sealing paint dabs, mounting holes drilled and/or tapped into heat sinks and/or chassis frames and finally the turtle shell-like heat sinks that some prior art modules are forced to carry on their backs. Moreover, since the heat sinks in the present invention are molded directly into the chassis where required, they can be properly sized for appropriate heat dissipation, thus further avoiding problems with prior art heat sinks.

Finally, the asymmetrical positioning of plugs and sockets assures that a particular electronic component will always be correctly positioned.

The appropriate shaping of the glass encapsulation in the embodiment of FIG. 3 and the provision of the simple finger-grip openings in the circuit board modules described in FIGS. 4 and 5 make it very easy for a consumer, or lay person to effect simple and most oftenly occurring required repairs.

The word "component" as used herein is meant to be generic, for example to mean a "transistor" and/or "circuit board;" that is, a "component" is herein defined as a unitary assemblage of one or more electronic parts.

I claim:
1. An electronic system including, in combination:
 (a) a plastic chassis;
 (b) a magnetic ring held in said plastic chassis with an exposed flat annular top surface coplanar with the top surface of said chassis;
 (c) a cooperating collar member of magnetically responsive material having an exposed flat annular bottom surface congruent with said exposed flat annular top surface for magnetic securement thereby;
 (d) electronic component holding means forming a part of said cooperating collar member;
 (e) an electronic component secured to said means and having downwardly extending asymmetrically positioned electrical connectors passing below and outside of said flat annular bottom surface of said collar member;
 (f) electrical connecting socket means embedded in said plastic chassis in corresponding asymmetrical positions outside said flat annular top surface of said magnetic ring which receive said electrical connectors, whereby said electrical connectors are received in the corresponding socket means, said annular top surface of said magnetic ring is in full surface contact with said flat annular bottom surface of said collar member so that the connections and electronic component are securely held by said magnetic ring and cooperating collar member.

2. A system according to claim 1, including a heat sink embedded in said plastic chassis with its top surface exposed and coplanar with the top surface of said chassis, said magnetic ring being embedded in said heat sink.

3. A system according to claim 2, in which said component includes a transistor having a flat metallic bottom and wire terminals extending out of its top, said collar member surrounding said transistor so that the flat metallic bottom of said transistor is coplanar with said flat annular bottom surface of said collar member whereby said flat annular top surface of said ring magnet is in full engagement with said flat annular bottom surface of said collar member, said metallic bottom of said transistor is in full surface contact with said heat sink.

4. The subject matter of claim 3, in which said transistor and upper portion of said collar member and upper portion of said wire terminals together with portions of said electrical connectors connected to said terminals are encapsulated in glass shaped for easy manual grasping to facilitate removal of said transistor and collar from said chassis for replacement.

5. A system according to claim 1, in which said component comprises a circuit board having a finger gripping means and defining left and right downwardly extending plugs, said electronic component holding means forming a part of said collar member comprising left and right ears, said circuit board being provided with left and right brass overlays riveted thereto to which said ears are soldered, said downwardly extending asymmetrically positioned electrical connectors comprising foil strips formed on said left and right plugs, said socket means in said plastic chassis including insulative left and right sockets of different internal dimensions corresponding to the external dimensions of said left and right plugs for receiving the same, said sockets including spring strips for effecting electrical connection to said foil strips when said plugs are received in said sockets.

6. A system according to claim 5, further including a transistor held in said collar member and having wire terminals extending from its top for connection to foil connectors on said circuit board, at least two wire terminals from the top of said transistor being insulated from said transistor by glass beads, said transistor having a flat metallic bottom coplanar with said flat annular bottom surface of said collar member; said plastic chassis having a heat sink embedded therein, said magnetic ring being held in said heat sink with its flat annular top surface coplanar with the surface of said heat sink so that said metallic bottom is in full surface contact with said heat sink when said collar member is in said given orientation.

7. A system according to claim 6, in which said plastic chassis is for a television receiver and said electrical component is one of several television receiver components, said chassis including further magnetic rings held therein all identical to said first mentioned magnetic ring and further asymmetrical left and right sockets associated with said additional magnetic rings respectively for reception of additional circuit boards making up said television receiver components, some of said additional magnetic rings being embedded in heat sinks of different sizes for appropriate heat dissipation of transistors incorporated in some of said additional components.

* * * * *